(12) United States Patent
Yu

(10) Patent No.: US 6,555,437 B1
(45) Date of Patent: Apr. 29, 2003

(54) MULTIPLE HALO IMPLANT IN A MOSFET WITH RAISED SOURCE/DRAIN STRUCTURE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,888

(22) Filed: Apr. 27, 2001

(51) Int. Cl.⁷ ............................................. H01L 21/336
(52) U.S. Cl. ....................................................... 438/300
(58) Field of Search ......................................... 438/300

(56) References Cited

U.S. PATENT DOCUMENTS

| | | | | |
|---|---|---|---|---|
| 5,818,098 A | * | 10/1998 | Davies et al. ................ | 257/506 |
| 6,090,691 A | * | 7/2000 | Ang et al. ................... | 438/564 |
| 6,114,211 A | * | 9/2000 | Fulford et al. .............. | 438/305 |
| 6,248,637 B1 | * | 6/2001 | Yu ............................... | 438/300 |
| 6,255,178 B1 | * | 7/2001 | Brown et al. ................ | 438/300 |

OTHER PUBLICATIONS

Jaeger, Richard C. Introduction to Microelectronic Fabrication, vol. V, Addison–Wesley, 1988, p. 125.*

* cited by examiner

*Primary Examiner*—Richard Elms
*Assistant Examiner*—Michael K. Luhrs
(74) *Attorney, Agent, or Firm*—LaRiviere Grubman & Payne, LLP

(57) ABSTRACT

A method and device for improving the channel doping profile of deep-submicron field effect transistors and MOSFETs. The method involves forming a multi-graded lateral channel doping profile by dual halo implants annealed at different temperatures to improve the threshold voltage roll-off characteristics of MOSFETs of 50 nm or less. The method includes forming a spacer on the sidewalls of a gate, followed by forming source/drain regions by epitaxial growth followed by a deep source/drain implant and anneal. After removal of the spacer, the first angled deep halo implant through the space formed by removal of the spacer and a second annealing at a temperature lower than the first anneal occurs. A second angled halo implant and a third anneal at a temperature less than the second anneal is performed. The microelectronic chip is then silicided and the MOSFET is further completed.

16 Claims, 6 Drawing Sheets

MULTIPLE HALO IMPLANT IN A MOSFET WITH RAISED SOURCE/DRAIN STRUCTURE

FIELD OF THE INVENTION

The present invention relates generally to field effect transistor fabrication methods, and more particularly to engineering of the channel under the transistor to counter short field effects in deep-submicron complementary (CMOS) field effect transistors on the same chip.

BACKGROUND ART

When a MOSFET gate length is scaled below approximately 100 nanometers (nm), short channel effects become significant factors. Strong or higher implant dose halo implants are widely used in deep submicron CMOS technology to engineer the FET channel to overcome short channel effects. Strong halo implants, however, tend to degrade channel mobility, resulting in low device drive current. The usual single halo implant is not sufficient to control threshold voltage ($V_{th}$) roll-off at 50 nm or smaller gate lengths. What is needed is a method of engineering the channel doping profile for overcoming the short channel effects in deep submicron CMOS chips having gate lengths of approximately 50 nm or less.

BRIEF SUMMARY OF THE INVENTION

The present invention is a method and device for improving the channel doping profile of deep-submicron field effect transistors and MOSFETs. The method involves creating a multi-graded lateral channel doping profile by dual halo implants annealed at different temperatures to improve the threshold voltage roll-off characteristics of MOSFETs of approximately 50 nm or less.

By way of example, and not of limitation, the method comprises the following steps after formation of the gate stack. A shallow source/drain extension implant is performed. A spacer is then formed on the sidewalls of the gate. A raised source/drain region is formed by selective epitaxy growth. Next, a deep source/drain implant is performed, followed by an anneal at a first temperature range. The spacer is then removed. A first, higher energy, halo is implanted with a small tilt angle through the gap where the spacer was removed, and then annealed at a second temperature range that is generally lower than the first anneal temperature range. A second, lower energy, halo is then implanted with a small tilt angle and then annealed at a third temperature range that is generally lower than the second temperature range. The differential temperature annealing of the halo implants results in a more localized, tightly distributed halo profile, close to the source/drain junction. A second spacer is then formed. The microelectronic chip is then silicided and the MOSFET is further completed. The resultant device operates at an increased speed compared to similar heretofore known devices. The instant method improves device density on the substrate and improves manufacturing precision and efficiency. Other features of the present invention are disclosed or apparent in the section entitled: "DETAILED DESCRIPTION OF THE INVENTION."

BRIEF DESCRIPTION OF THE DRAWING

For a fuller understanding of the present invention, reference is made to the accompanying Drawing. Reference numbers refer to the same or equivalent parts of the present invention throughout the several figures of the Drawing.

DETAILED DESCRIPTION OF THE INVENTION

Referring more specifically to the drawings, for illustrative purposes the present invention is embodied in the device and method generally shown in FIG. 1 through FIG. 6. It will be appreciated that the device may vary as to configuration and as to details of the components, and that the method may vary as to the specific steps and sequence, without departing from the basic concepts as disclosed herein.

Figure 1:
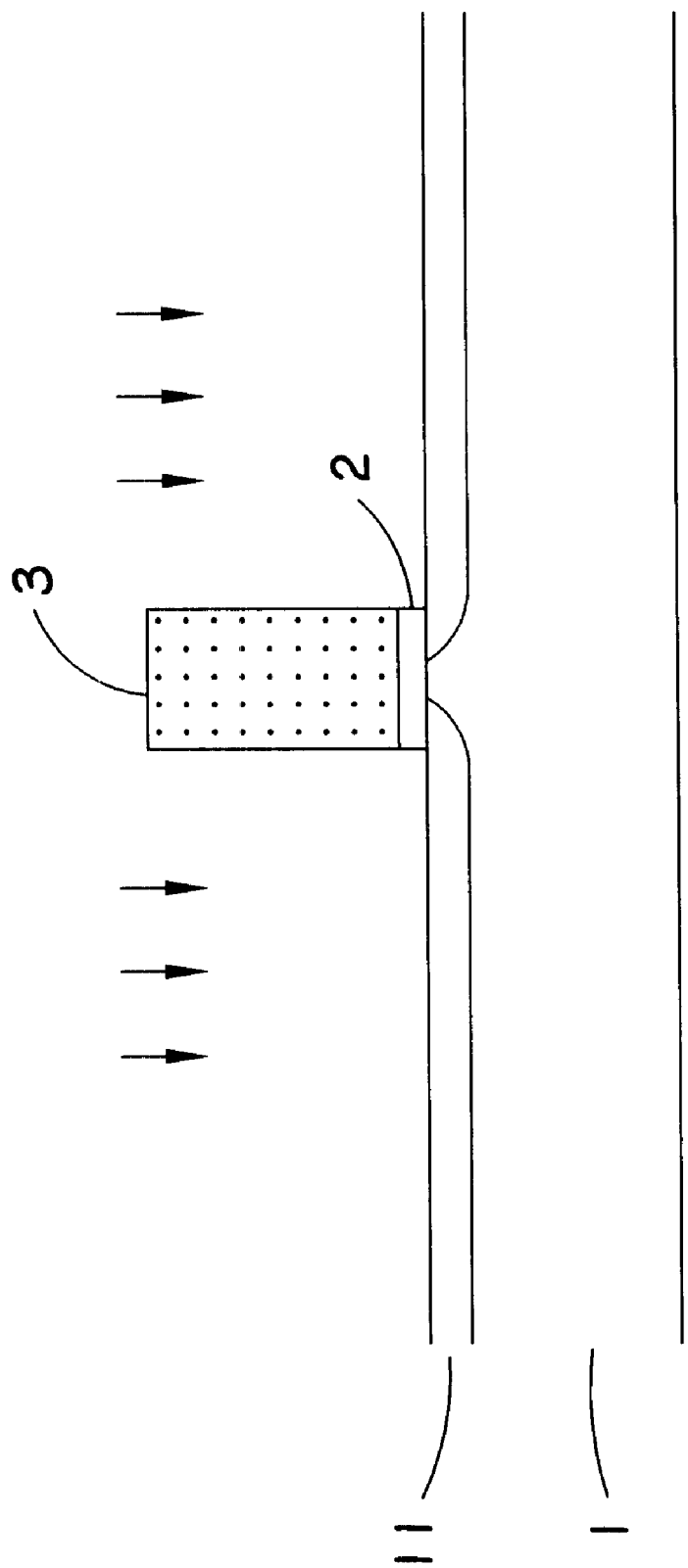
FIG. 1 is a schematic side view in cross-section of a semiconductor chip undergoing source/drain extension implant, in accordance with the present invention.

Referring first to FIG. 1, a substrate 1 having gate oxide 2 and gate 3 is prepared in the conventional manner. A shallow (approximately 10 nm to approximately 30 nm) source/drain extension implant at energy in the range of approximately 0.5 KeV to approximately 5.0 KeV of ions selected from the group: $B^+$, $BF_2^+$, $As^+$, $Sb^+$, $P^+$, forms source/drain extension 11.

Figure 2:
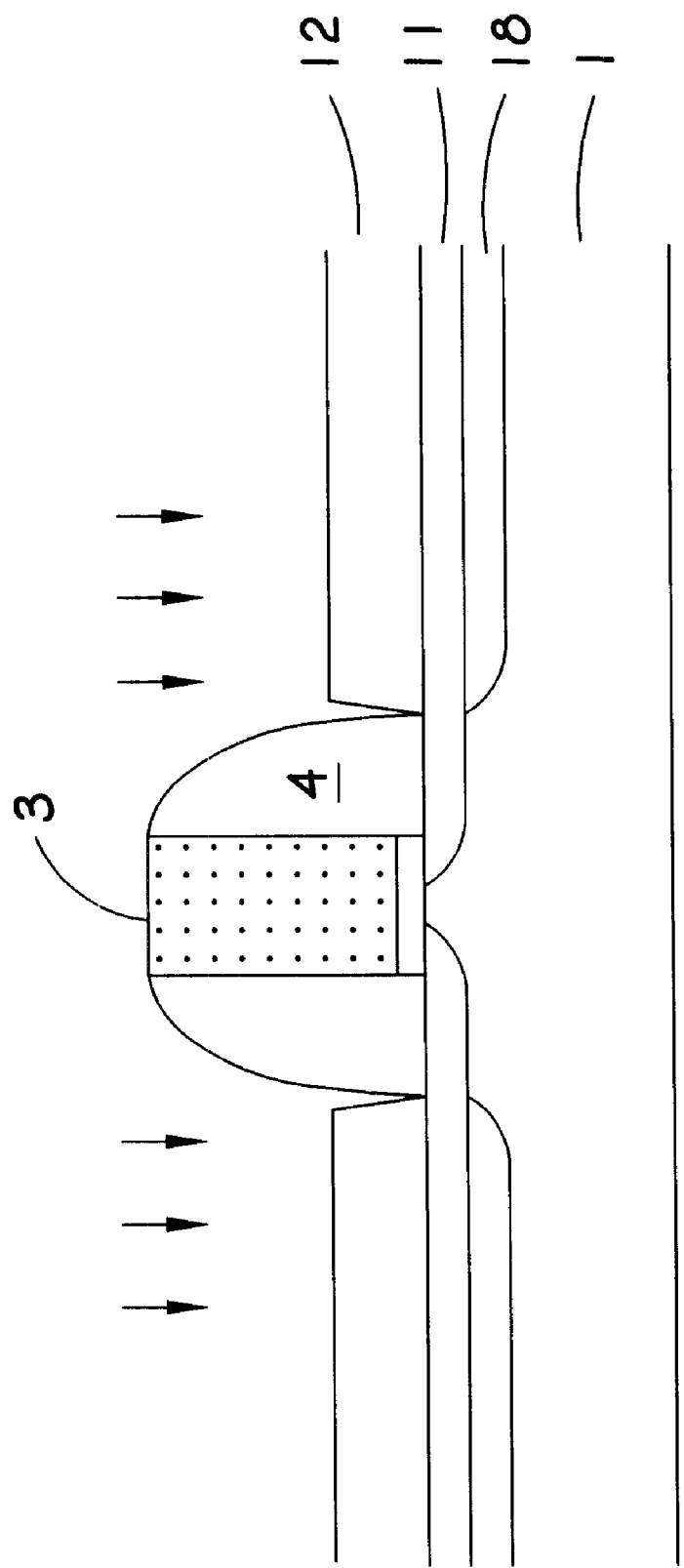
FIG. 2 is a schematic side view in cross-section of the chip of FIG. 1 undergoing deep source/drain implant, in accordance with the present invention.

Next, referring to FIG. 2, first spacer 4, typically a nitride, is formed, followed by forming raised source/drain regions 12 by epitaxial growth, followed then by a deep (approximately 40 nm to approximately 100 nm) source/drain implant at energy in the range of approximately 0.5 KeV to approximately 5.0 KeV of ions selected from the group: $B^+$, $BF_2^+$, $As^+$, $Sb^+$, $P^+$, and a first anneal at a temperature of approximately 1000° C. to approximately 1050° C. to form deep source/drain regions 18.

Figure 3:
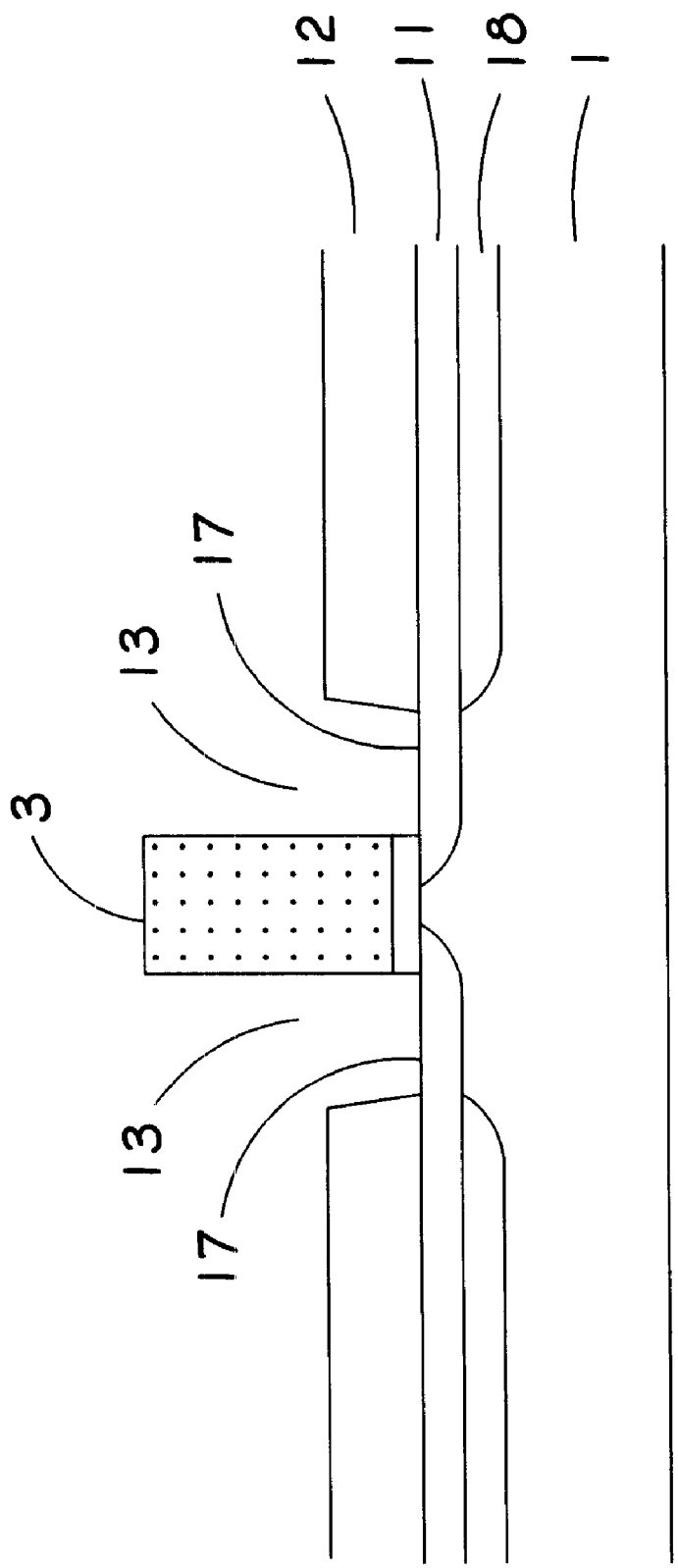
FIG. 3 is a schematic side view in cross-section of the chip of FIG. 2 ready for a shallow source/drain extension implant, in accordance with the present invention.

Referring to FIG. 3, the first spacer 4 is then removed, forming void 13 in the vacated space. Void 13 allows the subsequent halo implant regions to be annealed at a lower temperature because it exposes surface 17 to the annealing heat.

Figure 4:
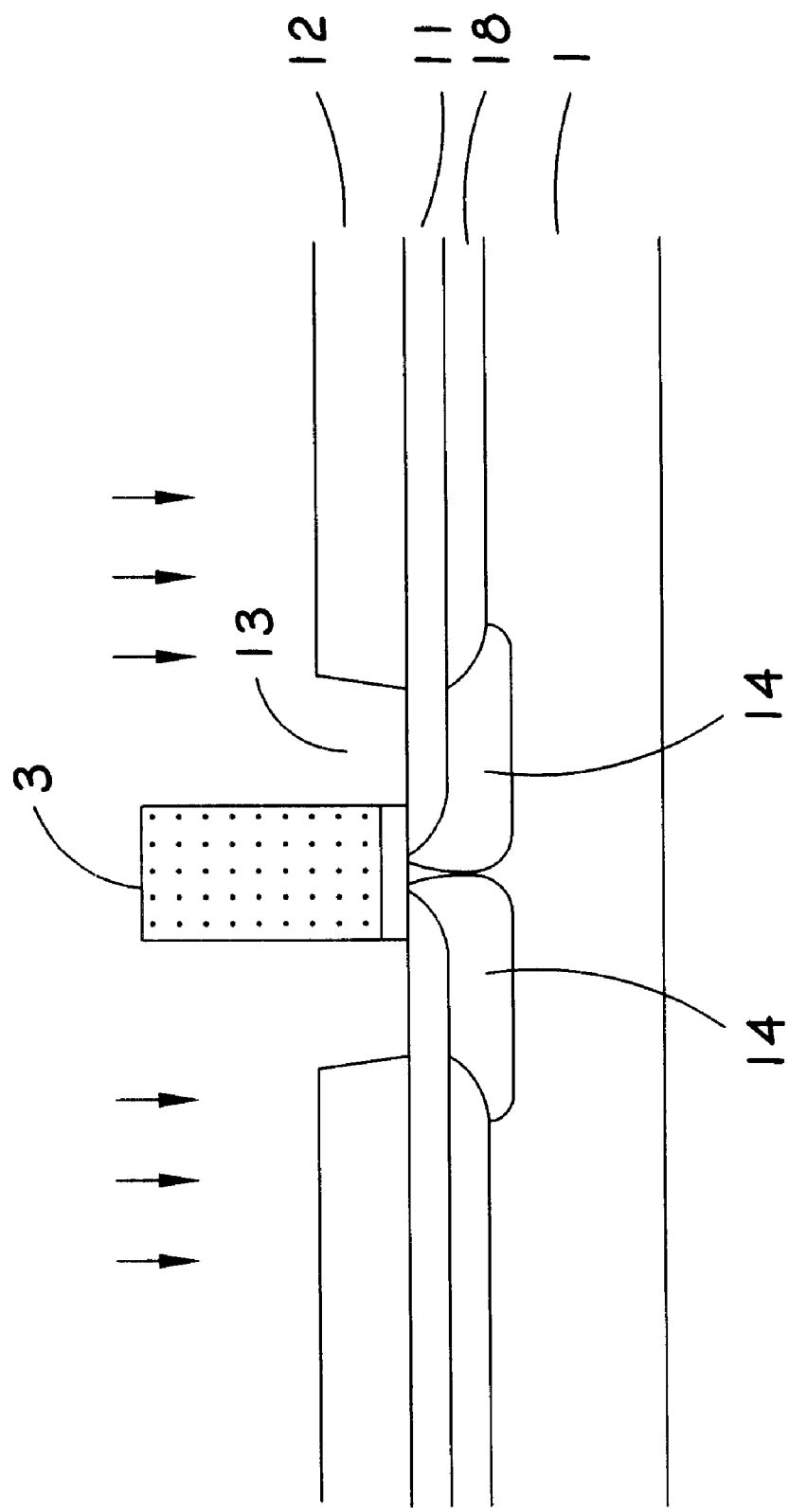
FIG. 4 is a schematic side view in cross-section of the chip of FIG. 3 undergoing a deep halo implant, in accordance with the present invention.

Next, as shown in FIG. 4, a deep (approximately 40 nm to approximately 100 nm) halo implant at energy in the range of approximately 5 KeV to approximately 60 KeV of ions selected from the group: $In^+$, $Ga^+$, $B^+$, $BF_2^+$, $As^+$, $Sb^+$, $P^+$ and with a tilt angle of approximately 0° to approximately 15° from the vertical, forms deep halo regions 14. The implant occurs primarily through void 13, using gate 3 and source/drain regions 12 as a mask. The chip is then annealed at a temperature of approximately 900° C. to approximately 1000° C.

Figure 5:
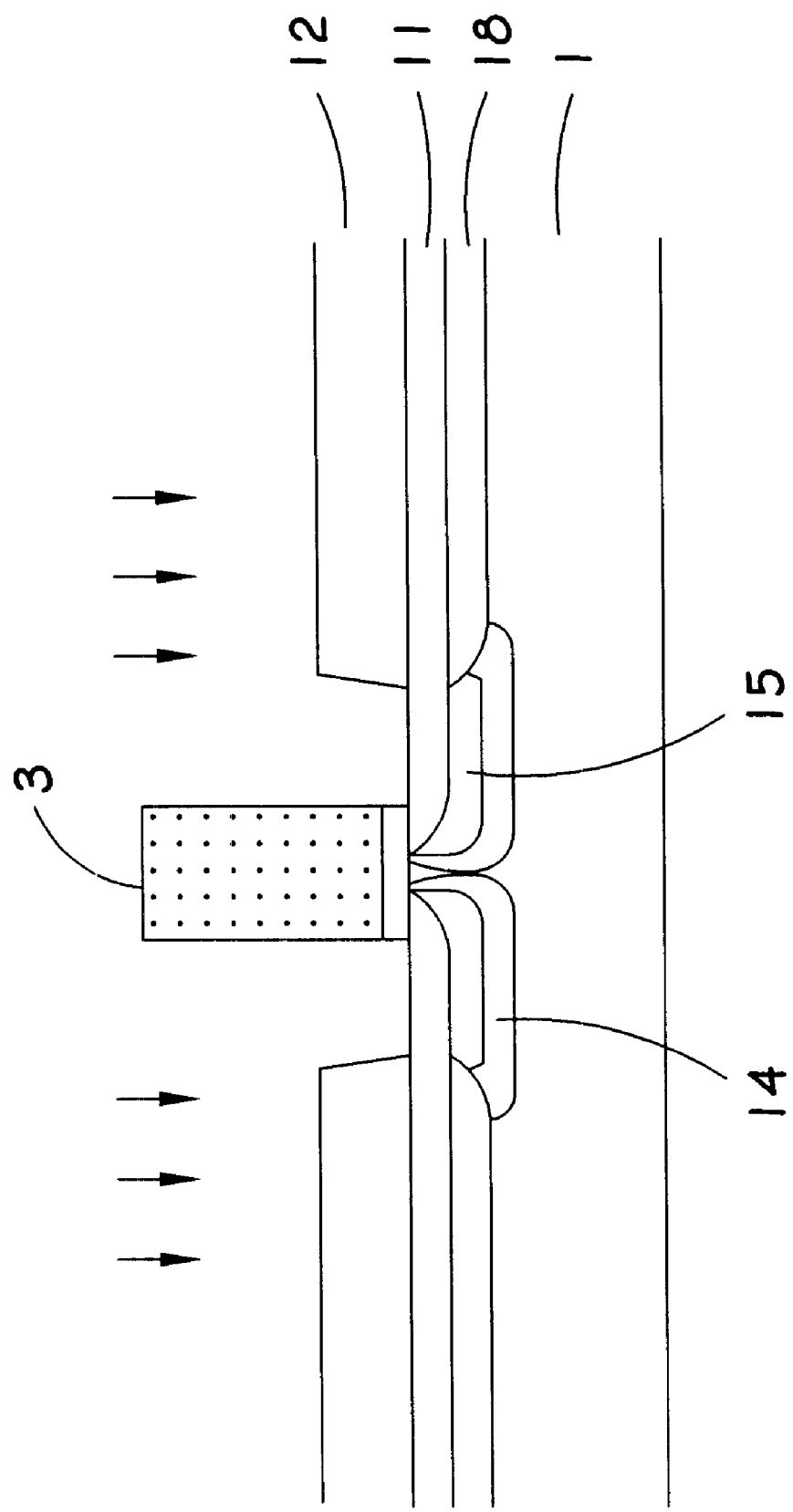
FIG. 5 is a schematic side view in cross-section of the chip of FIG. 4 undergoing a shallow halo implant, in accordance with the present invention.

Referring now to FIG. 5, a second halo implant through void 13 is then performed. This shallow (approximately 10 nm to approximately 30 nm) halo implant at energy in the range of approximately 5 KeV to approximately 60 KeV of ions selected from the group: $In^+$, $Ga^+$, $B^+$, $BF_2^+$, $As^+$, $Sb^+$, $P^+$ is also performed at a tilt angle of approximately 0° to approximately 15°, forming shallow halo region 15. The ions selected for each implant are chosen according to the design of the finished MOSFET and need not be the same ions implanted in earlier or subsequent implantations. A third anneal is then performed at a temperature of approximately 800° C. to approximately 900° C.

Figure 6:
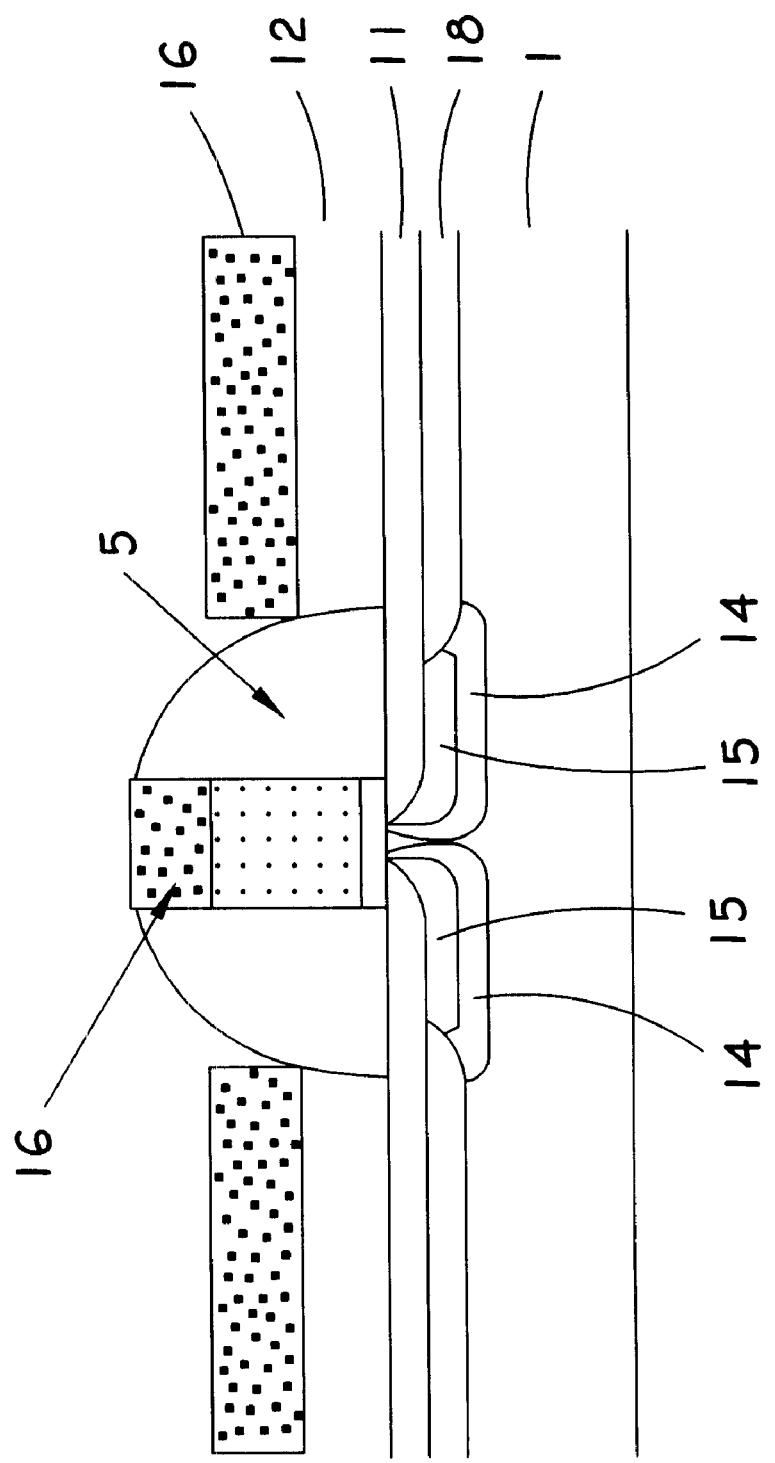
FIG. 6 is a schematic side view in cross-section of the chip of FIG. 5 after silicidation, in accordance with the present invention.

As shown in FIG. 6, a second spacer 5 of nitride or oxide is then formed on gate 3, followed by forming a silicide 16. The remainder of the MOSFET is then completed in the conventional manner.

Although the description above contains many specificities, these should not be construed as limiting the scope of the invention but as merely providing illustrations of some presently preferred embodiments of this invention. Thus, the scope of this invention should be determined by the appended claims and their legal equivalents. Therefore, the scope of the present invention fully encompasses other embodiments which may become obvious to those skilled in the art; and the scope of the present invention is accordingly limited by nothing other than the appended claims, in which reference to an element in the singular is not intended to mean "one and only one" unless explicitly so stated, but rather "one or more." All structural, chemical, and functional equivalents to the elements of the above-described preferred embodiments that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for."

What is claimed is:

1. A method of making a MOSFET, comprising:
   providing a substrate having a gate oxide and gate formed thereon;
   implanting a shallow source/drain extension dopant in the substrate, thereby forming a source extension region and a drain extension region;
   forming a spacer on a sidewall of the gate;
   forming raised source region and a raised drain region on the substrate;
   implanting a deep source/drain dopant in the substrate, thereby a deep source region and a deep drain region;
   annealing the substrate a first time;
   removing the spacer, thereby forming a void;
   implanting a deep halo dopant through the void and in the substrate, thereby forming a deep halo region;
   annealing the substrate a second time;
   implanting a shallow halo dopant in the substrate, thereby forming a shallow halo region;
   annealing the substrate a third time; and
   completing fabrication of the MOSFET.

2. A method, as recited in claim 1, wherein the raised source/drain regions are formed by selective epitaxial growth.

3. A method, as recited in claim 1, wherein the shallow source/drain extension dopant implanting step comprises implanting a dopant selected from a group consisting essentially of $B^+$, $BF_2^+$, $As^+$, $Sb^+$, $P^+$ to a depth range of approximately 10 nm to approximately 30 nm.

4. A method, as recited in claim 1, wherein the deep halo implanting step and the shallow halo implanting step comprise implanting a dopant selected from a group consisting essentially of $In^+$, $Ga^+$, $B^+$, $BF_2^+$, $As^+$, $Sb^+$, $P^+$ at an angular range of approximately 0° to approximately 15°.

5. A method, as recited in claim 1, wherein the first time annealing step is performed in a temperature range of approximately 1000° C. to approximately 1050° C.

6. A method, as recited in claim 1, wherein the second time annealing step is performed in a temperature range of approximately 900° C. to approximately 1000° C.

7. A method, as recited in claim 1, wherein the third time annealing step is performed in a temperature range of approximately 800° C. to approximately 900° C.

8. A method, as recited in claim 1, wherein the deep halo implanting step comprises implanting the dopant to a depth range of approximately 40 nm to approximately 100 nm.

9. A method, as recited in claim 1, wherein the shallow halo implanting step comprises implanting the dopant to a depth range of approximately 10 nm to approximately 30 nm.

10. A method, as recited in claim 1, wherein the shallow source/drain extension dopant implanting step comprises implanting the dopant in an energy range of approximately 0.5 KeV to approximately 5 KeV.

11. A method, as recited in claim 1, wherein the deep source/drain dopant implanting step comprises implanting the dopant in an energy range of approximately 0.5 KeV to approximately 5 KeV.

12. A method, as recited in claim 1, wherein the deep halo dopant implanting step comprises implanting the dopant in an energy range of approximately 5 KeV to approximately 60 KeV.

13. A method, as recited in claim 1, wherein the shallow halo dopant implanting step comprises implanting the dopant in an energy range of approximately 5 KeV to approximately 60 KeV.

14. A method, as recited in claim 1, farther comprising the step of forming a spacer on a sidewall of the gate a second time after the third time annealing step and before the completing step.

15. A method, as recited in claim 14, further comprising the step of forming a silicide on the gate and on the raised source/drain regions before the completing step.

16. A method of making a MOSFET, comprising:
   providing a substrate having a gate oxide and gate formed thereon;
   implanting a shallow source/drain extension dopant in the substrate, thereby forming a source extension region and a drain extension region;
   forming a spacer on a sidewall of the gate a first time;
   forming raised source region and a raised drain region on the substrate;
   implanting a deep source/drain dopant in the substrate, thereby a deep source region and a deep drain region;
   annealing the substrate a first time;
   removing the spacer, thereby forming a void;
   implanting a deep halo dopant through the void and in the substrate, thereby forming a deep halo region;
   annealing the substrate a second time;
   implanting a shallow halo dopant in the substrate, thereby forming a shallow halo region;

annealing the substrate a third time;

forming a spacer on a sidewall of the gate a second time;

forming a silicide on the gate and on the raised source/drain regions; and completing fabrication of the MOSFET, wherein the raised source/drain regions are formed by selective epitaxial growth, wherein the shallow source/drain extension dopant implanting step comprises implanting a dopant selected from a group consisting essentially of $B^+$, $BF_2^+$, $As^+$, $Sb^+$, $P^+$ to a depth range of approximately 10 nm to approximately 30 nm, wherein the deep halo implanting step and the shallow halo implanting step comprise implanting a dopant selected from a group consisting essentially of $In^+$, $Ga^+$, $B^+$, $BF_2^+$, $As^+$, $Sb^+$, $P^+$ at an angular range of approximately 0° to approximately 15°, wherein the first time annealing step is performed in a temperature range of approximately 1000° C. to approximately 1050° C., wherein the second time annealing step is performed in a temperature range of approximately 900° C. to approximately 1000° C., wherein the third time annealing step is performed in a temperature range of approximately 800° C. to approximately 900° C., wherein the deep halo implanting step comprises implanting the dopant to a depth range of approximately 40 nm to approximately 100 nm, wherein the shallow halo implanting step comprises implanting the dopant to a depth range of approximately 10 nm to approximately 30 nm, wherein the shallow source/drain extension dopant implanting step comprises implanting the dopant in an energy range of approximately 0.5 KeV to approximately 5 KeV, wherein the deep source/drain dopant implanting step comprises implanting the dopant in an energy range of approximately 0.5 KeV to approximately 5 KeV, wherein the deep halo dopant implanting step comprises implanting the dopant in an energy range of approximately 5 KeV to approximately 60 KeV, and wherein the shallow halo dopant implanting step comprises implanting the dopant in an energy range of approximately 5 KeV to approximately 60 KeV.

* * * * *